United States Patent [19]

Matsui

[11] Patent Number: 5,369,613

[45] Date of Patent: Nov. 29, 1994

[54] SEMICONDUCTOR MEMORY DEVICE HAVING CLAMPING CIRCIT FOR SUPPRESSING POTENTIAL DIFFERENCES BETWEEN PAIRS OF DATA I/O LINES

[75] Inventor: Yoshinori Matsui, Tokyo, Japan

[73] Assignee: NEC Corporation, Tokyo, Japan

[21] Appl. No.: 709,946

[22] Filed: Jun. 4, 1991

[30] Foreign Application Priority Data

Jun. 4, 1990 [JP] Japan .................... 2-145716

[51] Int. Cl.$^5$ .................... G11C 7/02; G11C 11/40
[52] U.S. Cl. .................... 365/189.06; 365/189.09
[58] Field of Search .................... 365/189.06, 189.09, 365/203, 189.04

[56] References Cited

U.S. PATENT DOCUMENTS

| | | | |
|---|---|---|---|
| 4,376,987 | 3/1983 | Hsia | 365/210 X |
| 4,740,926 | 4/1988 | Takemae et al. | 365/189.09 X |
| 4,785,427 | 11/1988 | Young | 365/189.06 |
| 4,825,413 | 4/1989 | Tran | 365/189.06 |
| 5,047,984 | 9/1991 | Monden | 365/203 |

FOREIGN PATENT DOCUMENTS 0031715 7/1981 European Pat. Off. .
0228266 7/1987 European Pat. Off. .

*Primary Examiner*—Seungsook Ham

*Attorney, Agent, or Firm*—Sughrue, Mion, Zinn, Macpeak & Seas

[57] ABSTRACT

The semiconductor memory device according to the present invention includes a memory cell array consisting of a plurality memory cells provided in array form and a plurality of bit lines and word lines connected respectively to the plurality of memory cells, I/O lines consisting of a first wiring and a second wiring connected to a predetermined number of bit lines out of the plurality of the bit lines via a selection circuit, and a clamping circuit which is activated at the time of read and includes a first device which connects the first wiring and the second wiring when the potential of the first wiring exceeds the potential of the second wiring by more than a predetermined voltage value, and a second device which connects the first wiring and the second wiring when the potential of the second wiring exceeds the potential of the first wiring by more than the predetermined voltage. Thus, even when a potential drop is generated in the I/O lines during the transition period, a marked drop in the potential of one of the wirings can be prevented by the clamping operation between the two wirings that constitute the I/O lines. Accordingly, it is possible to prevent the destruction of data in the memory cells, and to enhance the reading speed of the next data because of the small value of the potential drop of the wiring.

6 Claims, 5 Drawing Sheets

SEMICONDUCTOR MEMORY DEVICE HAVING CLAMPING CIRCIT FOR SUPPRESSING POTENTIAL DIFFERENCES BETWEEN PAIRS OF DATA I/O LINES

BACKGROUND OF THE INVENTION

1. Field of the Invention

The present invention relates to a semiconductor memory device and, more particularly, to a circuit used in such a device for adjusting the potential level of input/output (I/O) lines for connecting common data buses to bit lines in a memory cell array.

2. Description of the Prior Art

A semiconductor memory device includes a memory cell array having a plurality of memory cells arranged in array form, a plurality pairs of bit lines and a plurality of word lines, these bit and word lines being connected to the memory cells. A row decoder and a column decoder for selecting a predetermined memory cell are disposed adjacently to the memory cell array. Further included in the memory device are I/O lines for transferring data read out of and written into the selected memory cell and a plurality of sense amplifiers each amplifying a potential difference between the corresponding bit line pair. The I/O lines are connected through a corresponding one of the selection switches to one of the sense amplifiers. The I/O lines are further connected to common data buses which are in turn coupled via a buffer circuit and an I/O line selecting circuit to an input/output pad provided on the periphery of a semiconductor chip.

In general, for the purpose of improving a data read operation speed, such techniques are applied so that the I/O lines include two wirings in a pair forming a complementary relationship in potential level. A small potential difference appears between the pair of wirings in response to read-out data and the absolute potential value of each I/O line being close to a power supply voltage. In order to set the potential difference appearing between the wiring pair to have a small amplitude, a precharging circuit is provided for supplying the I/O line pair from the power supply voltage during read operation. The precharging circuit includes two transfer gates each coupled between the power terminal and the corresponding one of the I/O lines and turned ON during read operation.

The precharging circuit thus supplies the power voltage to the I/O lines during read operation. On the other hand, the sense amplifier, which is coupled to the I/O lines via the corresponding selection switch, responds to the stored data of the selected memory cell appearing the bit line pair and is intended to raise one of the I/O lines to the high level (the power voltage) and the other of them up to the low level (a ground voltage). Since, however, the driving capability of one sense amplifier is smaller than the driving capability of the precharging circuit, the other I/O line does not drop down to the grounding potential, but is lowered only by about 5% below the power voltage. Thus, the potential difference appearing between the I/O lines becomes small, so that a set-up time for reading out next data is shortened. The data read operation is thereby performed at a high speed.

Recent semiconductor memory devices have been equipped with the so-called fast page mode of operation in which a random read access operation is continuously performed a plurality times on a plurality of memory cells coupled to one word line selected by a row address. In the fast page mode of operation, after reading of data stored in one memory cell, a read operation on another memory cell is carried out by updating only a column address without applying a row address. In other words, such an operation is repeated a plurality of times so that after reading one data in response to the content of the column address, the column address is updated to another content to couple another bit line pair, i.e. another sense amplifier, to the I/O lines via the corresponding selection switch, data stored in the memory cell corresponding to the other content of the column line being thereby read out.

However, during the period from the read of one data to the read of the next data, i.e., during the transition period of the sense amplifier to be coupled to the I/O lines being changed by the selection switch, the column decoder often activates simultaneously a plurality of the selection switches due to the deviation in changing timing of the column address or the like, resulting in the so-called multiselecting state of the selection switches. The I/O lines is thereby driven simultaneously by a plurality of sense amplifiers. For this reason, the potential difference between the I/O lines is broadened, and in the worst case one of the I/O lines is lowered to a potential level that is lower than one half of the power voltage. As a result, the data read operation speed is lowered. More importantly the data stored in the memory cell may be destroyed.

SUMMARY OF THE INVENTION

It is therefore an object of the present invention to provide an improved semiconductor memory having a fast page mode function.

It is another object of the present invention to provide a semiconductor memory device in which a remarkable potential drop of the I/O is prevented even when the multiselected state of selection switches occurs during transition period due to change in address information.

A semiconductor memory device according to the present invention comprises a plurality bit lines, a plurality of word lines, a plurality of memory cells each coupled to one of the bit lines and one of the word lines, a plurality of sense amplifiers provided correspondingly to the bit lines, first and second I/O lines, a selection circuit provided between the I/O lines and the sense amplifiers for connecting the I/O lines to selected one of the sense amplifiers, a precharging circuit for supplying a power voltage to the I/O lines during data read operation, and a clamping circuit coupled to the I/O lines and activated during the data read operation, the clamping circuit forming an electrical path between the first and second I/O lines when a voltage difference between the first and second I/O lines exceeds a predetermined voltage level.

Accordingly, the voltage difference between the I/O lines is prevented from broadening beyond the predetermined voltage level by the clamping circuit. The data read operation is thus performed at a high speed.

It is convenient that the clamping circuit forms the electrical path between the first and second I/O lines by use of first and second transistors. The source-drain paths of the transistors are connected in parallel between the first and second I/O lines during at least data read operation. The gate of the first transistor is connected to the first I/O line and the gate of the second transistor is connected to the second I/O line during at least data read operation.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE INVENTION

Figure 1:
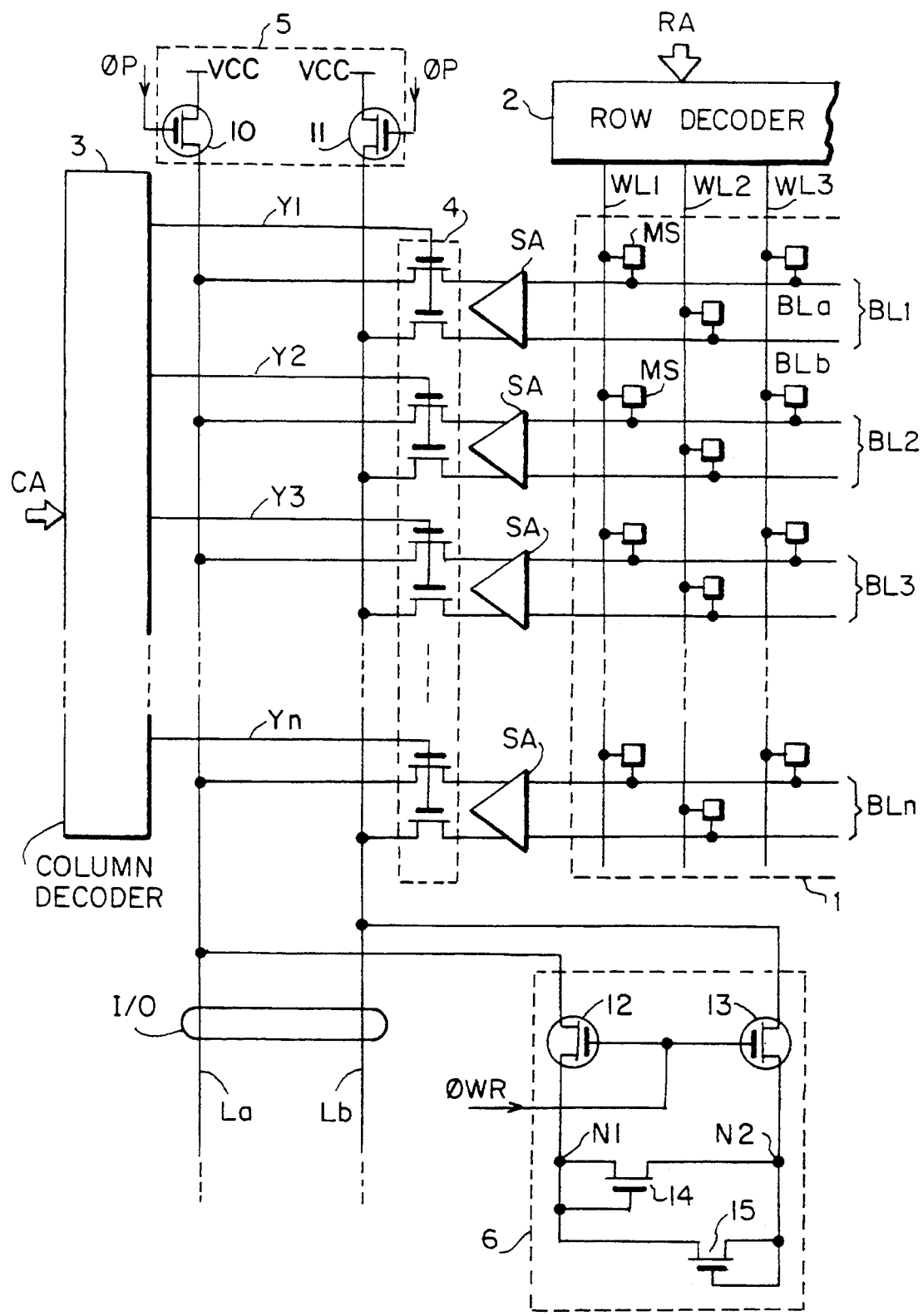
FIG. 1 is a circuit diagram showing a part of a semiconductor memory device according to a first embodiment of the present invention.

Referring to FIG. 1, the first embodiment of the present invention will be described. As shown in FIG. 1, a memory cell array 1 includes a plurality of memory cells MS each being of the so-called one transistor one capacitor type consisting of one N-channel transistor and one capacitor. The array 1 further includes a plurality of word lines WL and a plurality of pairs of bit lines BL. One of each bit line pair is denoted by "BLa" and the other of them is denoted by "BLb". The memory cells are connected to the word lines WL and bit line pairs BL as shown. Although not shown, a dummy memory cell is provided to each of the bit lines BLa and BLb. When the odd number word line such as W1 is selected, dummy memory cells provided to the bit line BLb are activated. On the other hand, in the case of selecting the even number word line such as W2, dummy memory cells provided on the bit line BLa are activated. Row decoder 2 selects one of the word lines WL in response to a row address RA. Each of the bit line pairs BL is connected to corresponding one of a plurality of sense amplifiers SA which are in turn coupled to a pair of I/O lines La and Lb via a switch circuit 4. Column decoder 3 supplies selection signals Y1, Y2, Y3, ..., Yn to the selection switch 4 and changes one of the selections Y to the active high level in response to a column address CA. The selection switch 4 is constructed by a group of transistors whose gates receive the selection signals Y1, Y2, Y3, ..., Yn from the column decoder 3, and whose source-drain paths are provided between the input/output terminals of the sense amplifiers SA and the I/O lines La and Lb. Thus, one of the sense amplifiers SA is connected to the I/O lines La and Lb in response to the column address CA. The I/O lines La and Lb transfers data read out and written into the selected memory cell in a complementary manner, and are connected to a data read amplifier and a data write amplifier (both not shown), respectively. The I/O lines La and Lb are further connected to a precharging circuit for supplying a power voltage Vcc to the I/O lines during data read operation. The precharging circuit 5 includes P-channel transistors 10 and 11 which receive at their gates a control signal $\phi_p$ taking the active low level during data read operation.

Further connected to the I/O lines La and Lb is a clamping circuit 6 which is provided in accordance with the present invention. The clamping circuit 6 has a function of preventing the potential difference appearing between the I/O lines La and Lb during data read operation from exceeding a predetermined voltage level and includes two P-channel transistors 12 and 13 and two N-channel transistors 14 and 15. The gates of the transistors 12 and 13 are supplied with a control signal $\phi_{WR}$ which goes to the active low level during data read operation. The source-drain path of the transistor 12 is connected between the I/O line La and a node N1, and the source-drain path of the transistor 13 is connected between the I/O line Lb and a node N2. The nodes N1 and N2 are connected to the gates of the transistors 14 and 15, respectively. The source-drain paths of the transistors 14 and 15 are connected in parallel between the nodes; N1 and N2.

An operation of this memory device will be described below with reference to FIGS. 1 to 3. During data read operation, the control signals $\phi_{WR}$ and $\phi_P$ are both at the active low level (see FIGS. 2(a) and 2(b)). Until one bit line pair is selected by input of a row address RA and a column address CA to the row decoder 2 and the column decoder 3, respectively, what happens is simply the supply of the source voltage to the wirings La and Lb that constitute the I/O lines via the P-channel transistors 10 and 11. Accordingly, the potential levels of both of the wirings La and Lb are the Vcc level (5V, for example) (see FIG. 2(d)).

Next, after one word line WL is selected by the row decoder 2 in response to a row address RA, a column address CA is input (see FIG. 2(c)). Assuming that the column decoder 3 outputs the selection signal Y1 of the active high level in response to the column address CA (see FIG. 2(e)), a bit line pair that corresponds to it is selected by the selection switch 4. The levels of the selected bit line pair BLa and BLb are such that BLa is at the high level and BLb is at the low level corresponding to the data stored in a memory cell MS selected in response to the address, so that the sense amplifier SA also operates so as to send BLa to the high level and BLb to the low level.

The bit line BLa selected by the selection switch 4 is electrically connected to the wiring La, and the bit line BLb is connected to the wiring Lb, so that the wiring La maintains the Vcc level but the potential of the wiring Lb is caused to be dropped to the low level by the sense amplifier SA of the selected bit line pair. However, the voltage level of the wiring Lb does not go to ground potential, but goes to a potential level which is about 200 to 300 mV below Vcc since the driving capability of each sense amplifier SA is smaller than the driving capability of the precharging circuit 5 (see FIG. 2(d)).

The potential difference between the I/O lines La and Lb is amplified by a data amplifier (not shown), and the result is output as a read data to an input/output terminal (not shown) via a common bus, completing the read operation for one data.

When this read operation is in the fast page mode, the read of the next data is repeatedly executed by reading a data stored in another memory cell MS controlled by the same word line by updating the column address CA without applying a row address RA (see FIG. 2(c)). When the next column address CA is input the column decoder 3 sets the selection signal Y1 at the inactive level (low level) as well as sets the next selection signal (Y2 in the present case) corresponding to the column address CA to the active level (see FIG. 2(e)).

Figure 2:
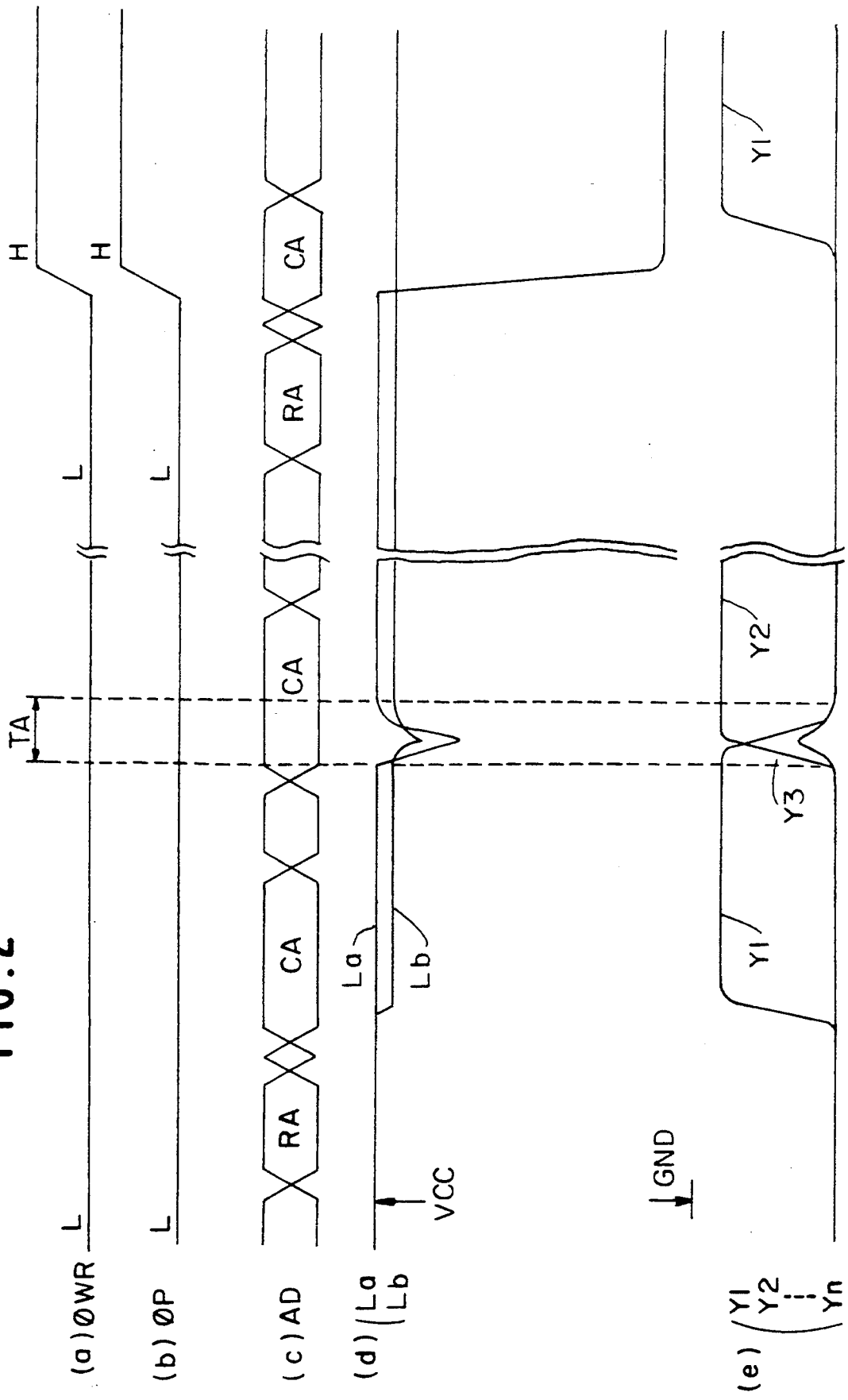
FIG. 2 is a timing chart for explaining an operation of the semiconductor memory device shown in FIG. 1.
Figure 3:
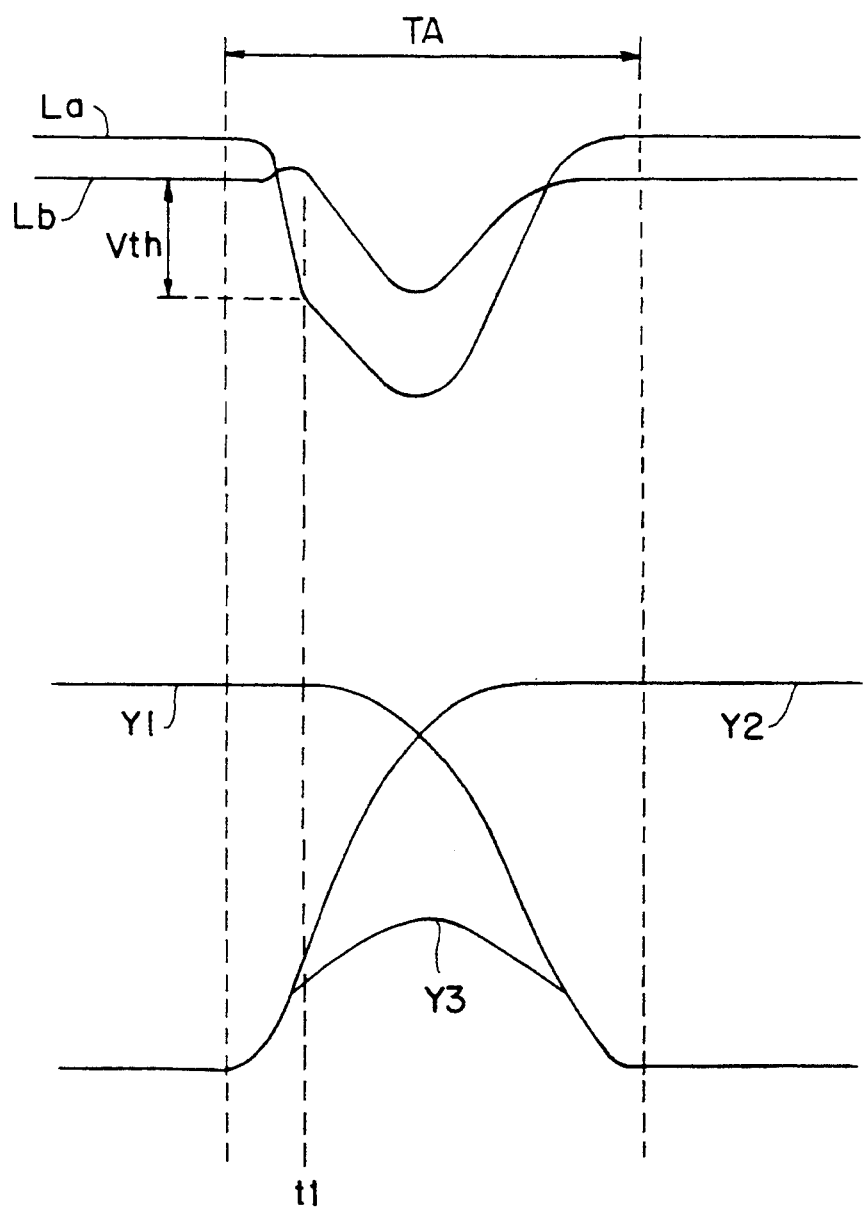
FIG. 3 is a waveform diagram showing in more detail a part of the waveform shown in FIG. 2.

During the transition period TA during which the selection signal is switched, there sometimes occurs a case in which the column decoder 3 goes to a state (the state where the selection signal Y3 goes to the high level in FIG. 2) which generates a control signal that will select a bit line pair, due to a slip of the input timing of the input column address CA or the like. Sometimes there occurs a case in which there are generated a plurality of selection signals that are at the high level. In such a case, there occurs a state in which a plurality of the bit line pairs are connected to the I/O lines, namely, the selection switch is in a multiselect state.

The transition period TA in FIG. 2 shows a multiselect state where a large number (about eight) of sense amplifiers SA are selected simultaneously. In this case, in the prior art, depending upon the combination of the high and low levels of the selected bit line pair, the level of one of the wirings (for example, the wiring La) is set at a potential (2V, for example) which is smaller than one half of the source potential by the sense amplifier SA of the selected bit line pair, giving rise to a possibility of destroying the data in the memory cell. However, in accordance with the present embodiment even in the case such as this it becomes possible by the clamping operation of the clamping circuit 6, which will be described later in detail, to bring the potential difference between the wirings La and Lb to below a predetermined potential value and suppress the minimum potential of the wiring La to about 1.5V (see FIG. 2(d)). In this way, the probability of data destruction can be reduced and the read speed can be enhanced compared with the conventional device.

After elapse of the transition period TA, a bit line pair corresponding to the column address CA is selected, and one data is read by the same operation as described in the above. Furthermore, by a repeated input of column addresses CAs for a predetermined number of times there can be realized a read operation by the fast page mode which reads out at high speed the data that are stored in the memory cells controlled by one word line WL.

On the other hand, at the time of write operation, as a row address RA and a column address CA for write are input (see FIG. 2(c)), both of the control signals $\phi_{WR}$ and $\phi_p$ go to inactive level (high level), and at the same time the wirings La and Lb are set by a write amplifier (not shown) at a low level (close to the ground level) and a high level corresponding to the write data (see FIG. 2(d)). Then, a write data is stored in one memory cell MC, by bringing one selection signal (Y1 in the present case) to the active level in response to the column address by means of the column decoder.

Next, referring to FIG. 3, the operation of the clamping circuit 6 during the transition period TA will be described in more detail. As a column address CA for reading the next data is input after the read of one data the selection signal (Y2 in the present case) corresponding to the column address starts to rise. On the other hand, the selection signal Y1 which has so far been at the high level starts to fall. At this time, sometimes there occurs a case in which other selection signal (Y3 in the present case) also rises to a certain potential due to a slip in the input timing of the input column address CA or the like. Depending upon the circumstances there may arise a case in which a large number of selection signals such as Y3 are generated. If many bit line pairs are simultaneously selected as in this case, depending upon the combination of the high and low levels of the selected bit line pair, the level of one of the wirings (wiring La in the present case) starts to fall rapidly toward the low level by means of the sense amplifier SA for the selected bit line pair. Since the control signal $\phi_{WR}$ at this time is at the active level, the transistors 12 and 13 are in an energized state, and the potential of the node N1 falls toward the low level along with that of the wiring La. At this time, the potential of the wiring Lb rises on the contrary to a certain extent toward Vcc by the action of the sense amplifier.

When the potential of the wiring La goes down, and as the potential difference between the wirings La and namely, the potential difference between the nodes N1 and N2 exceeds the threshold voltage Vth (700 mV, for example) of the N-channel transistor 15 (see t1 in FIG. 3), the N-channel transistor 15 goes to the energized state, causing a current to flow from the node N2 to the node N1 and clamping the potential difference between the I/O lines La and Lb. Since the I/O line La is electrically connected to the I/O line Lb with potential near Vcc, the rate of potential drop is decreased, and it is possible to restrain the drop to the eventual minimum potential of the wiring La to about one half of that of the conventional device. Accordingly, even in the case where according to the prior art the potential of one of the wirings goes to below one half of the source voltage (below 2V, for example) because of the multiselect state, it becomes possible to restrain the minimum potential of the wiring La to about 3.5V by the clamping action of the clamping circuit 6 in accordance with the present embodiment.

The clamping operation will remain effective during the period when the potential of the wiring La stays low. Then, when the level of Y3 or the like falls and the level of the wiring La is caused to start to rise by the precharging circuit 5, the potential difference between the nodes N1 and N2 becomes smaller than the threshold voltage Vth, making the N-channel transistor 15 de-energized and the potentials of both of the wirings to rise rapidly.

As a result of the above operation, even if there is generated during the transition period a large potential drop in the I/O lines which according to the prior art might destroy the data in the memory cells, the potential drop of one of the wirings can be prevented from falling to a large extent because of the clamping circuit 6 clamps the potential difference between the two wirings that constitute the I/O lines. Accordingly, it is possible to prevent the destruction of the data in the memory cells as well as to enhance the speed of the next read operation since the potential drop of the wiring is small.

It should be mentioned that in the above description an example has been shown where the potential of the wiring La drops rapidly when the selection switch is in the multiselect state. On the contrary, however, when the potential of the wiring Lb drops rapidly to the low level, the potential difference between the node N1 and the wiring Lb exceeds the threshold voltage Vth of the N-channel transistor 14. Then, a current flows this time from the node N1 to the node N2 to realize the clamping operation, obtaining an effect similar to the above.

Figure 4:
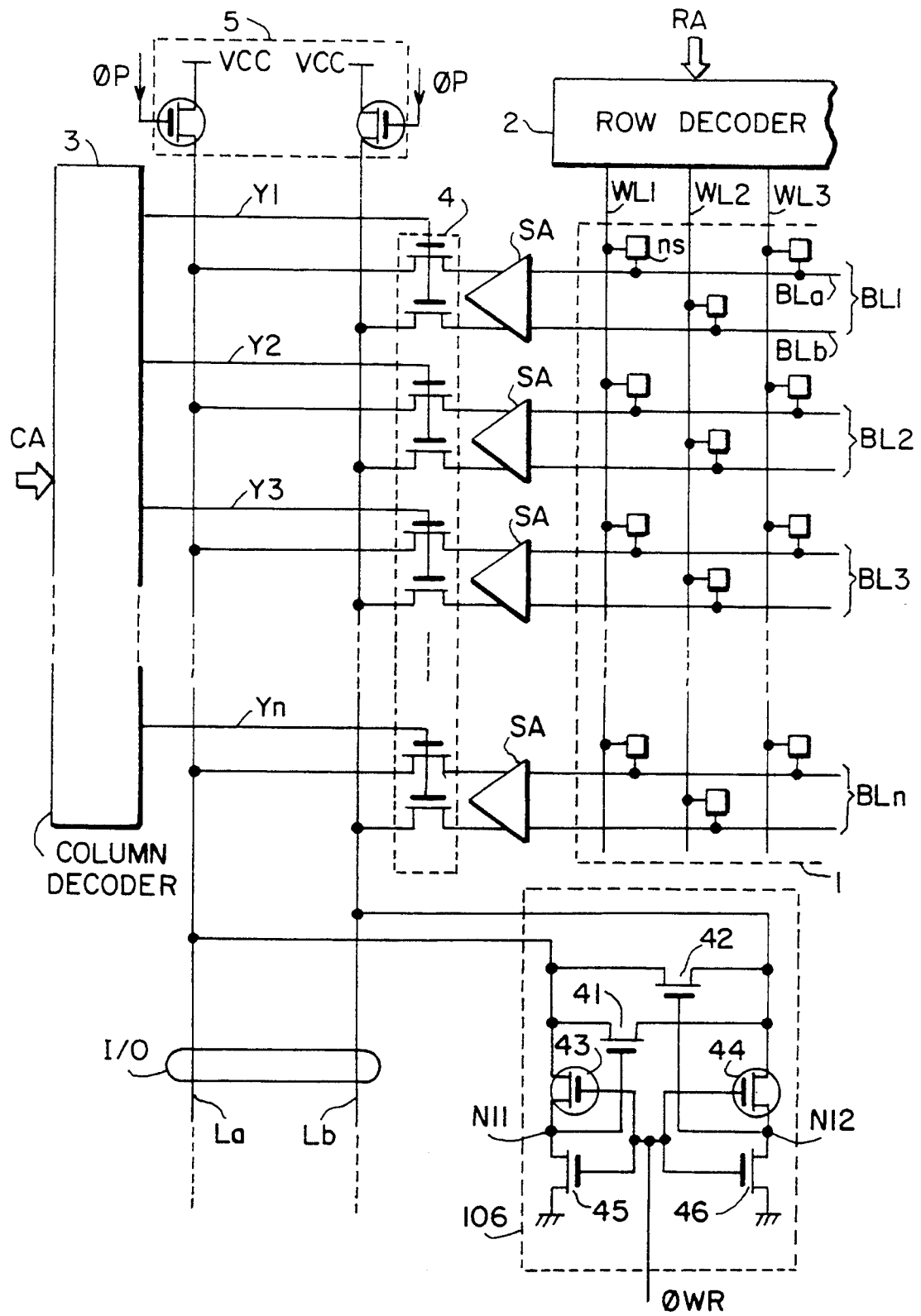
FIG. 4 is a circuit diagram showing a part of a semiconductor memory device according to a second embodiment of the present invention.

Next, referring to FIG. 4, a second embodiment of the present invention will be described. The difference between the present embodiment and the first embodiment shown in FIG. 1 resides in the construction of the clamping circuit, with other construction remaining the same. The clamping circuit 106 according to the present embodiment comprises an N-channel transistor 41 whose gate is connected to node N11 and whose source-drain path is provided between the wirings La and Lb that constitute the I/O lines, an N-channel transistor 42 whose gate is connected to node N12 and whose source-drain path is provided between the wirings La and Lb that constitute the I/O lines, a P-channel transistor 43 whose gate receives a control signal $\phi_{WR}$ which goes to an active level (low level) at the time of read and whose source-drain path is provided between the wiring La and the node N11, a P-channel transistor 44 whose gate receives the control signal $\phi_{WR}$ and whose source-drain path is provided between the wiring La and the node N12, an N-channel transistor 45 whose gate receives the control signal $\phi_{WR}$ and whose source-drain path is provided between a grounding and the node N11, and an N-channel transistor 46 whose gate receives the control signal $\phi_{WR}$ and whose source-drain path is provided between the grounding and the node N12.

Figure 5:
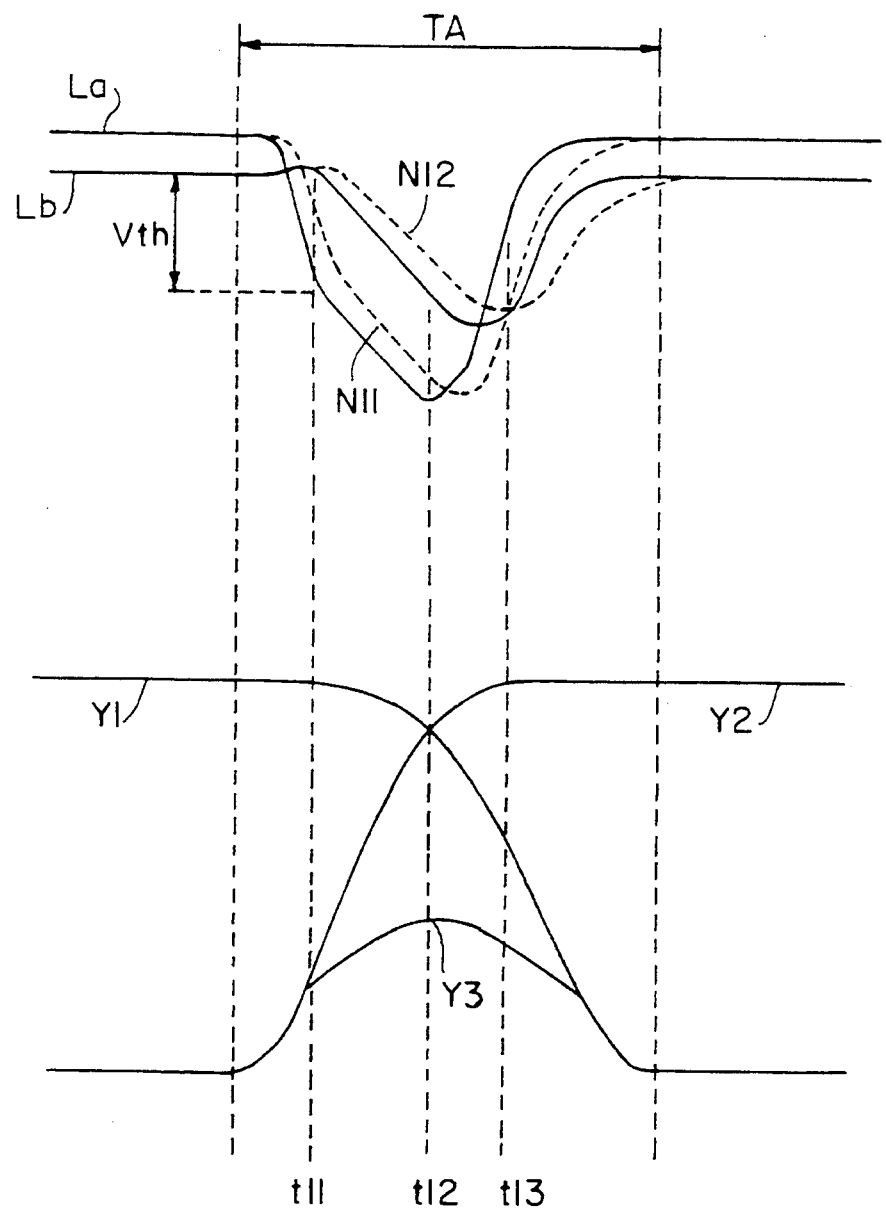
FIG. 5 is a waveform diagram for explaining the operation of the semiconductor memory device shown in FIG. 4.

Next, referring to FIG. 5, the operation of the present embodiment will be described. The difference in operation between the present embodiment and the first embodiment is only the operation of the clamping circuit 106 during the transition period TA, with other operation remaining the same, so that the operation during the transition period TA alone will be described.

When a column address CA for reading the next data is input after the read of one data, the selection signal (Y2 in the present case) that corresponds to the column address starts to rise toward the high level. On the other hand, the selection signal Y1 which has so far been at the high level starts to fall toward the low level. At this time, if selection signals such as Y3 are generated in large number and there are selected simultaneously many bit line pairs, as in the case of the first embodiment, the level of one of the wirings (wiring La in the present case) is caused to fall rapidly by the action of the sense amplifier SA of the selected bit line pair, depending upon the combination of the high and low levels of the selected bit line pairs.

Since the control signal $\phi_{WR}$ is at the active level (low level) at this time, the P-channel transistors 43 and 44 go to the energized state while the N-channel transistors 45 and 46 go to the de-energized state. In the present embodiment, the potentials of the nodes N11 and N12 fall toward the low level delayed by the extent that corresponds to the circumstance that they are determined via the P-channel transistors 43 and 44 (see the broken line in FIG. 5). At this time, the potential of the wiring Lb rises on the contrary somewhat toward Vcc by the action of the sense amplifier.

When the potential of the wiring La continues to fall, and the potential difference between the wiring La and the node N12 exceeds the threshold voltage Vth (700 mV, for example) of the N-channel transistor 42 (see t11 in FIG. 5), the N-channel transistor 42 goes to the energized state, a current flows from the wiring Lb to the wiring La, and the potential difference between the wirings La and Lb is clamped. As a result of this clamping operation, the rate of the fall toward the low level is reduced, and it becomes possible to restrain the minimum potential of the wiring La in comparison to the case of the prior device analogous to the first embodiment.

The aforementioned clamping operation remains effective while the potential of the wiring La is at the low level. In the present embodiment, however, even when the level of Y3 or the like falls and the levels of the wirings La and Lb start to rise by the precharging circuit 5, the potential of the node N12 changes delayed as shown by the broken line by the action of the P-channel transistor 44, so that the potential difference between the wiring La and the node N12 at that time (t12 in FIG.5) is equal to the threshold voltage of the N-channel transistor. Accordingly, the N-channel transistor 42 is still maintaining the energized state immediately after the potential of the wiring La has started to rise, and the rise of the wiring La which is connected electrically to the wiring Lb that is at a potential level higher than its own level is faster than that in the first embodiment. Following that, when the potential of the wiring rises higher and the difference of the potential from that of the node N12 becomes smaller than the threshold voltage Vth, the N-channel transistor 42 goes to the de-energized state.

Since the N-channel transistor 42 is energized even at the time (t12 in FIG. 5) when the level of Y3 or the like has fallen, the potential level of the wiring Lb continues to fall thereafter until the potential difference between the wiring Lb and the node N12 becomes equal to the threshold voltage. Consequently, the rise of the potential of the wiring La to the high level is achieved faster than the wiring Lb, the potential of the wiring La becomes conversely higher than the potential of the wiring Lb, making the potential difference between the wiring exceed the threshold voltage Vth (t13 in FIG. 5). However, the change of potential of the node N11 occurs delayed as shown by the broken line due to the presence of the P-channel transistor 43, so that the potential difference between the wiring Lb and the node N11 at that time (t13 in FIG. 5) is smaller than the threshold voltage Vth of the N-channel transistor 41. Therefore, the N-channel transistor 41 does not go to the energized state, and it becomes possible for the wiring La to rise rapidly from that state to the high level.

It should be noted that when a multiselect state takes place and the wiring Lb falls rapidly similar to the first embodiment, the potential difference between the node N11 and the wiring Lb exceeds the threshold voltage Vth of the N-channel transistor 41. Then, a current flows this time from the wiring La to the wiring Lb, giving rise to the clamping operation, and makes it possible to obtain an effect similar to the above.

As described in the above, the present embodiment has an effect in which the rise of the wiring potential occurs sooner than in the first embodiment. Moreover, in contrast to the first embodiment which requires a total of four transistors, namely, the P-channel transistors 12 and 13, and the N-channel transistors 14 and 15, for permitting a current due to the potential difference between the wirings La and Lb to flow, it suffices in the present embodiment to employ two N-channel transistors 41 and 42. Since the transistors for passing a current have to be designed to be large in size, it becomes possible in the second embodiment to construct a clamping circuit with smaller formation region than in the first embodiment. This is because a smaller number of large-sized transistors for current passing is required than in the first embodiment, and small transistors may be used for the rest, in spite of the larger number of transistors that are required.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor memory device comprising:
a plurality of bit lines,
a plurality of word lines,
a plurality of memory cells each coupled to one of said bit lines and one of said word lines,
a plurality of sense amplifiers provided correspondingly to said bit lines,
first and second I/O lines,
a selection circuit provided between said I/O lines and said sense amplifiers for coupling one of said sense amplifiers to said I/O lines, and
a clamping circuit being activated in a data read operation mode and forming an electrical path between said first and second I/O lines when a potential difference between said first and second I/O lines exceeds a predetermined voltage level.

2. The semiconductor memory device comprising:
a plurality of bit lines;
a plurality of word lines;
a plurality of memory cells each coupled to one of said bit lines and one of said word lines;
a plurality of sense amplifiers provided correspondingly to said bit lines;
first and second I/O lines;
a selection circuit provided between said I/O lines and said sense amplifiers for coupling one of said sense amplifiers to said I/O lines; and
a clamping circuit being activated in a data read operation mode and forming an electrical path between said first and second I/O lines when a potential difference between said first and second I/O lines exceeds a predetermined voltage level,
wherein said clamping circuit includes a first transistor having a gate connected to a first node and a source-drain path connected between said first node and a second node, a second transistor having a gate connected to said second node and a source-drain path connected between said first node and said second node, and means for connecting said first and second nodes to said first and second I/O lines, respectively, in at least said data read operation mode.

3. The semiconductor device comprising;
a plurality of bit lines;
a plurality of word lines;
a plurality of memory cells each coupled to one of said bit lines and one of said word lines;
a plurality of sense amplifiers provided correspondingly to said bit lines;
first and second I/O lines;
a selection circuit provided between said I/O lines and said sense amplifiers for coupling one of said sense amplifiers to said I/O lines; and
a clamping circuit being activated in a data read operation mode and forming an electrical path between said first and second I/O lines when a potential difference between said first and second I/O lines exceeds a predetermined voltage level,
wherein said clamping circuit includes a first transistor having a gate connected to a first node and a source-drain path connected between said first node and a second node, a second transistor having a gate connected to said second node and a source-drain path connected between said first and second nodes, a first transfer gate connected between said first I/O line and said first node and activated in said data read operation mode, and a second transfer gate connected between said I/O line and said second node and activated in said data read operation mode.

4. The semiconductor memory device comprising:
a plurality of bit lines;
a plurality of word lines;
a plurality of memory cells each coupled to one of said bit lines and one of said word lines;
a plurality of sense amplifiers provided correspondingly to said bit lines;
first and second I/O lines;
a selection circuit provided between said I/O lines and said sense amplifiers for coupling one of said sense amplifiers to said I/O lines; and
a clamping circuit being activated in a data read operation mode and forming an electrical path between said first and second I/O lines when a potential difference between said first and second I/O lines exceeds a predetermined voltage level,
wherein said clamping circuit includes a first transistor having a gate connected to a first node and a source-drain path connected between said first and second I/O lines, a second transistor having a gate connected to a second node and a source-drain path connected between said first and second I/O lines, a first transfer gate connected between said first I/O lines and said first node and activated in said data read operation mode, and a second transfer gate connected between said second I/O lines and said second node and activated in said data read operation mode.

5. The semiconductor memory device as claimed in claim 4, wherein said clamping circuit further includes a third transfer gate connected between said first node and a reference potential point and activated in a data write operation mode, and a fourth transfer gate connected between said second node and said reference potential point and activated in said data write operation mode.

6. The semiconductor memory device as claimed in claim 1, wherein said clamping circuit includes first means coupled between said first and second I/O lines for forming a conductive path therebetween when a potential level of said first I/O line becomes smaller than the potential level of said second I/O line by said predetermined voltage level and second means coupled between said first and second I/O lines for forming a conductive path therebetween when the potential level of said second line becomes smaller than the potential level of said first I/O line by said predetermined voltage level.

* * * * *

UNITED STATES PATENT AND TRADEMARK OFFICE
CERTIFICATE OF CORRECTION

PATENT NO. : 5,369,613
DATED : February 17, 1995
INVENTOR(S) : Yoshinori Matsui

It is certified that error appears in the above-indentified patent and that said Letters Patent is hereby corrected as shown below:

Col. 5, line 31, delete "1.5V" and insert --3.5V--.
Col. 6, line 14, after "and" insert --Lb--.

Signed and Sealed this

Fourth Day of April, 1995

BRUCE LEHMAN

Attest:

Attesting Officer        Commissioner of Patents and Trademarks